United States Patent [19]

Eastcott

[11] 4,016,496
[45] Apr. 5, 1977

[54] METHOD AND APPARATUS FOR PRODUCING RAMP SIGNALS WITH ROUNDED INFLECTION POINTS

[75] Inventor: Peter deHertel Eastcott, Peterborough, Canada

[73] Assignee: Canadian General Electric Company Limited, Toronto, Canada

[22] Filed: Sept. 19, 1975

[21] Appl. No.: 615,054

[30] Foreign Application Priority Data

Dec. 16, 1974  Canada .................. 216282

[52] U.S. Cl. .................. 328/35; 307/229; 307/261; 328/127; 328/142
[51] Int. Cl.² .................. H03K 5/08; G06G 7/18
[58] Field of Search ............. 328/35, 36, 127, 142, 328/173, 175; 307/228, 229, 261, 263

[56] References Cited
UNITED STATES PATENTS

| | | | |
|---|---|---|---|
| 3,312,837 | 4/1967 | Flynn et al. ............. | 307/263 |
| 3,350,612 | 10/1967 | Hansen et al. ............. | 318/143 |
| 3,405,286 | 10/1968 | Mudie ............. | 307/228 |
| 3,444,394 | 5/1969 | Colvson ............. | 328/127 |
| 3,526,300 | 9/1970 | Ferrot ............. | 187/29 |
| 3,552,524 | 1/1971 | Benjamin et al. ............. | 187/29 |
| 3,772,533 | 11/1973 | Bruckner et al. ............. | 307/263 |
| 3,777,855 | 12/1973 | Boyldew et al. ............. | 187/29 R |
| 3,852,674 | 12/1974 | Van Roessel ............. | 328/127 |

OTHER PUBLICATIONS

Hitachi Review, vol. 21, No. 6, June 1972, pp. 243–251.

*Primary Examiner*—Stanley D. Miller, Jr.
*Attorney, Agent, or Firm*—Arnold E. Renner; Philip L. Schlamp

[57] ABSTRACT

Ramp signals having rounded starts and finishes are provided through the method of producing an electrical voltage signal comprised of approximately circular portions and approximately straight line portions wherein the straight line portions are approximately tangential to the circular portions. In achieving the desired ramp signals, suitable circuitry is provided in which, in one embodiment, a high gain amplifier is selectively fed a step input voltage to initiate the ramp signal. The amplifier has a voltage limited output and is series connected to a first integrator. The first integrator has a voltage limited output and is series connected to a second integrator which produces the required ramp signal. The circuit also contains two feedback loops. The output from the first integrator is fed to the input of the high gain amplifier via an inverting amplifier. The output of the second integrator is fed to the high gain amplifier via a resistor. When the step input voltage is reduced to zero volts, the circuit produces a smoothed ramp signal in the reverse direction.

11 Claims, 3 Drawing Figures

METHOD AND APPARATUS FOR PRODUCING RAMP SIGNALS WITH ROUNDED INFLECTION POINTS

BACKGROUND OF THE INVENTION

This invention relates in general to signal generation, and in particular, to a method and apparatus for producing ramp signals having rounded starts and stops.

When controlling the speed of motors, particularly motors used with elevators, mine hoists, metal rolling mills, paper mills, etc., it is desirable to have smooth and rapid starts as well as smooth and rapid stops. In elevators and mine hoists it is desirable to have smooth starts and stops in order to provide a comfortable and pleasing ride for the passengers; it is also desirable to have relatively rapid starts and stops to speed the transportation of the passengers and eliminate any unnecessary delays. There must, of course, be some compromise between speed and smoothness of ride; the ride could be very smooth by providing slow starts and stops, but this would not be very rapid; on the other hand, the speed could be increased by having sudden, jerky, starts and stops.

With metal rolling mills, the stops and starts must be controlled in order to prevent excessive stressing of the metal. If the starts and stops are too sudden, the metal undergoing treatment is exposed to high stresses and strains, producing an undesirable product. If, on the other hand, the stops and starts are too slow, valuable time, and accordingly production, is lost.

A similar problem occurs in paper mills. The paper when being wound, must be kept under a carefully controlled tension. If the tension becomes too great, due to either a sudden stop or start, the paper may tear or break; if the tension becomes too low, the paper may crease and fold while being wound.

One prior art method of motor control, for use in an elevator application, is described in the *Hitachi Review*, Vol. 21, No. 6, dated June 1972, on pages 243–251. That description discloses the use of a speed pattern circuit as shown in FIG. 5 of said review. The aim is to obtain trapezoid wave acceleration characteristics (see FIG. 12 of said review) which are smooth at each inflection point in the trapezoid acceleration characteristics.

Various other methods for regulating the speed and acceleration of elevators or motors can be found in the following U.S. patents: U.S. Pat. No. 3,526,300 dated Sept. 1, 1970; U.S. Pat. No. 3,350,612 dated Oct. 31, 1967; U.S. Pat. No. 3,552,524 dated Jan. 5, 1971; and U.S. Pat. No. 3,377,855 dated Dec. 11, 1973.

SUMMARY OF THE INVENTION

It is, therefore, an object of the present invention to produce ramp signals having rounded starts and stops.

It is another object to produce ramp signals having rounded starts and stops by the method of producing an electric voltage signal comprised of approximately circular portions and approximately straight line portions wherein the straight line portions are approximately tangential to the circular portions.

A further object is to provide a circuit for producing an electrical ramp signal having rounded starts and stops.

A still further object is to provide a circuit for producing a signal, the derivative of which has an approximately trapezoidal shape.

Still another object is to provide a circuit for producing a control signal which can be used to produce motor acceleration having approximately trapezoid wave acceleration characteristics.

Briefly stated, the present invention provides for the generation of ramp signals having rounded starts and stops through the production of a control signal, which, when plotted on a voltage vs. time curve consists solely of straight line portions and circular portions wherein the straight line portions are tangential to the circular portions, so that the transition from one portion to another is relatively smooth. When used for controlling a motor, the circular portions can be considered as indicating a uniformly varying rate of acceleration, and the straight line portions indicating a constant rate of acceleration. The term acceleration shall be used throughout this description in its broadest meaning; i.e., acceleration shall mean the rate of change of velocity with respect to time. Accordingly, positive acceleration shall mean a change in velocity of an object in which the magnitude of velocity increases in the direction of travel of the object; negative acceleration shall mean a change in velocity in which the magnitude of velocity decreases in the direction of travel of the object and is commonly referred to as deceleration.

The preferred means for achieving the desired ramp signal comprises a circuit including a high gain amplifier which is fed a step input signal when it is desired to initiate the required control signal. The output from this high gain amplifier is voltage limited and this output is then fed into a first integrator connected in series to the output of the high gain amplifier. The output from the first integrator is likewise voltage limited and is series connected to a second integrator. The second integrator outputs the required signal and in addition, the output from the second integrator is fed back to the input of the high gain amplifier. Also, the output from the first integrator is fed into an inverting amplifier and then into the same input of the high gain amplifier as were the step input signal and the signal from the second integrator. When the step input is removed from the input of the high gain amplifier the circuit commences to return to a zero voltage output level (as measured at the output of the second integrator).

DESCRIPTION OF THE DRAWING

The invention will now be described in more detail with reference to the accompanying drawing, in which.

DETAILED DESCRIPTION

Figure 1:
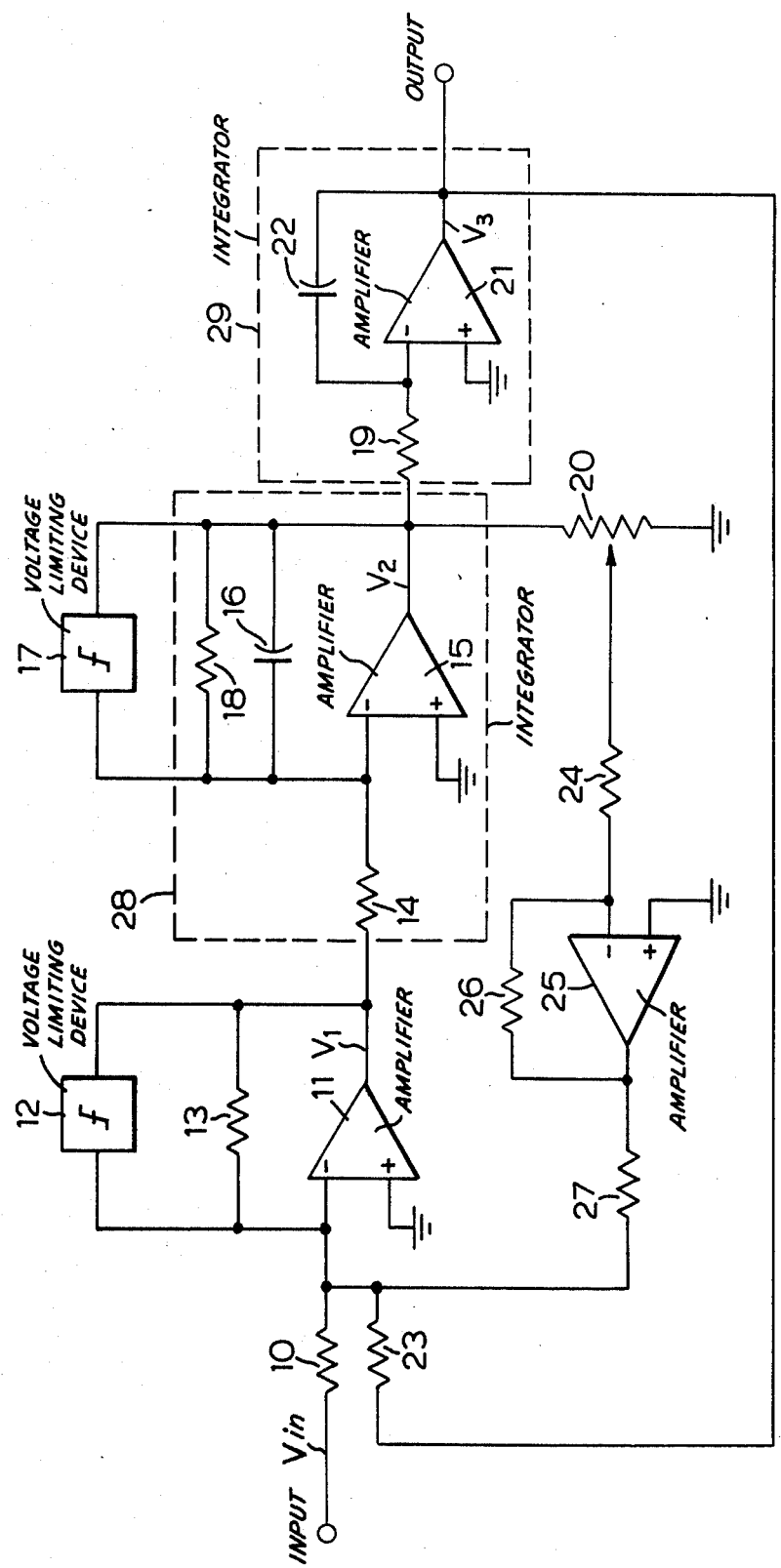
FIG. 1 is a simplified schematic of one circuit embodiment of the invention.

FIG. 1 depicts a circuit for practicing the present invention which circuit produces a reference or control signal one use of which is to govern the speed of a motor such that the acceleration of the motor will be characterized by an approximately trapezoidal shape. It is to be understood that the component values (and consequently, the voltages and currents) as given in this specification are for one specific application of the invention only, and different values can be employed depending upon the exact result desired. Accordingly, the component values (and the voltage and current values) given herein should not be considered as a limitation of the invention in any manner whatsoever, but rather, considered solely as examples for illustrative purposes.

The circuit of FIG. 1 has one input and one output as so labelled in the figure. An input voltage $V_{in}$, which is applied to the input, is a step input (as shown in FIG. 2a). Voltage $V_{in}$ has a minimum value of approximately zero volts, and a maximum value of approximately +10 volts (as shown in FIG. 2a; alternately, other voltage ranges could be used). Voltage $V_{in}$ is fed through a resistor 10 into the inverting input of operational amplifier 11 which outputs a voltage $V_1$. (The inverting input of all operational amplifiers in the figures is designated by a negative (−) sign and the non-inverting input is designated by a positive (+) sign.) A feedback resistor 13 is connected between the output and inverting input of amplifier 11 in the manner well known in the art. The combination of the operational amplifier 11 and the resistors 10 and 13 form a "high gain" amplifier wherein the approximate absolute voltage gain (i.e., $V_1/V_{in}$) is given by the ratio of the values of resistors 10 and 13; i.e., $V_1/V_{in} \approx$ value of resistor 13 in ohms/value of resistor 10 in ohms. As will be discussed later, amplifier 11 is actually used as a "weighting amplifier". In the particular circuit now being described with respect to FIG. 1, resistor 10 has a value of approximately 47 kilohms (47 KΩ) and resistor 13 has a value of approximately two megohms (2000 KΩ). Accordingly, the approximate absolute voltage gain ($V_1/V_{in}$) is given by the ratio 2000 KΩ/47 KΩ which is approximately 42.5. In this description the term "high gain", when used in reference to amplifier 11, will mean an absolute voltage gain of approximately 40 or greater. A voltage limiting device 12, which can be any known voltage limiting device, is connected between the output of operational amplifier 11 and its inverting input. The purpose of device 12 is to limit the maximum absolute value of the output voltage $V_1$ to some prescribed value, for example, 10 volts. As such the value of the voltage $V_1$ can range, in the present example, from −10 volts to +10 volts. In different applications, different maximum absolute values of voltage $V_1$ could be used. One example of an amplifier 11 suitable for use in the circuit of FIG. 1 is a 741 C operational amplifier manufactured by Analog Devices, Inc., although other suitable operational amplifiers can also be used.

The output voltage $V_1$ from amplifier 11 is fed to integrator 28 which includes an operational amplifier 15 with a resistor 14 in series with its inverting input and capacitor 16 and resistor 18 connected in parallel between its output and inverting input. Resistor 18 provides a small d.c. feedback so that an offset (error) voltage cannot continuously charge the feedback capacitor 16 until amplifier 15 limits. The value of resistor 18 in this example is approximately ten megohms and the value of resistor 14 is approximately 100 kilohms. The value of capacitor 16 can vary from application to application; in the present example it has a value of 1.0 microfarads. The derivation of the value of capacitor 16 for different applications will be explained later in the description. The output voltage $V_2$ from amplifier 15 is limited to a maximum absolute value (e.g., 10 volts) by a voltage limiting device 17 connected between the inverting input and the output of amplifier 15. The device 17 can be any known voltage limiting device and the maximum absolute value of output voltage $V_2$ can vary for different applications. Amplifier 15 may be a 741 C operational amplifier, the same type as used for the amplifier 11, although, as before, other operational amplifiers can also be used.

The output voltage $V_2$ from amplifier 15 is fed into two separate devices. It is fed both to a resistor 19 which forms the input of a second integrator 29 and to a potentiometer 20 which has its free end connected to ground and which may, in the present example, have a value of 20 kilohms. Resistor 19 is connected in series to the inverting input of an amplifier 21 which, in turn, outputs a voltage signal $V_3$ (the desired control signal) as shown in FIG. 1. A capacitor 22 is connected between the inverting input and the output of amplifier 21 and the combination of the operational amplifier 21, capacitor 22 and resistor 19 form the main elements of the integrator 29. In this specific example, the value of capacitor 22 is 1.0 microfarads and the value of resistor 19 is 180 kilohms. The derivation of the value of capacitor 22 and resistor 19 for various applications will be shown later. Operational amplifier 21 may also be a 741 C operational amplifier as were amplifiers 11 and 15.

The voltage signal $V_3$ from amplifier 21 is the desired output signal; however, two feedback loops must yet be described before the circuit is complete. The signal $V_3$ is fed through a resistor 23 to the same inverting input of amplifier 11 as receives the input voltage $V_{in}$ via resistor 10. In this example, the value of resistor 23 is 100 kilohms, although, for different applications, different values of resistor 23 can be used, to give the circuit any desired overall voltage gain.

The second feedback loop starts with a signal taken from the wiperarm of potentiometer 20. This signal is fed through a resistor 24 into the inverting input of an operational amplifier 25. In the present example, resistor 24 has a value of 100 kilohms and amplifier 25 may be a 741 C operational amplifier. A resistor 26 is connected between the inverting input and the output of operational amplifier 25 so that the combination of amplifier 25 and resistors 24 and 26 act as an amplifier. The values of the resistors 24 and 26 are chosen such that amplifier 25 has an absolute voltage gain of approximately unity and, as such, are approximately equal; e.g., 100 kilohms. Because of the method of connection, however, the signal output from amplifier 25 has the opposite sign as does its input. Amplifier 25 together with resistors 24 and 26 produces a voltage gain of approximately minus unity (−1) and is commonly referred to as a sign changer or inverter. The output of amplifier 25 is fed through a resistor 27 and into the same inverting input of amplifier 11 as were the signals by way of resistors 10 and 23. The value of resistor 27 in the present example is 39 kilohms but this may be varied to give potentiometer 20 the desired range of adjustment.

As mentioned previously, operational amplifier 11 is connected as a "weighting amplifier", sometimes referred to as a "scaling adder". The inverting input of amplifier 11 is fed with a total of three input signals through resistors 10, 23 and 27. The result is that the voltage $V_1$ from the output of amplifier 11 is the amplified algebraic sum of the three signals appearing at the inverting input of amplifier 11. "Weighting Amplifiers" amplifiers of this type are well known and accordingly this arrangement will not be described in any further depth.

Figure 2:
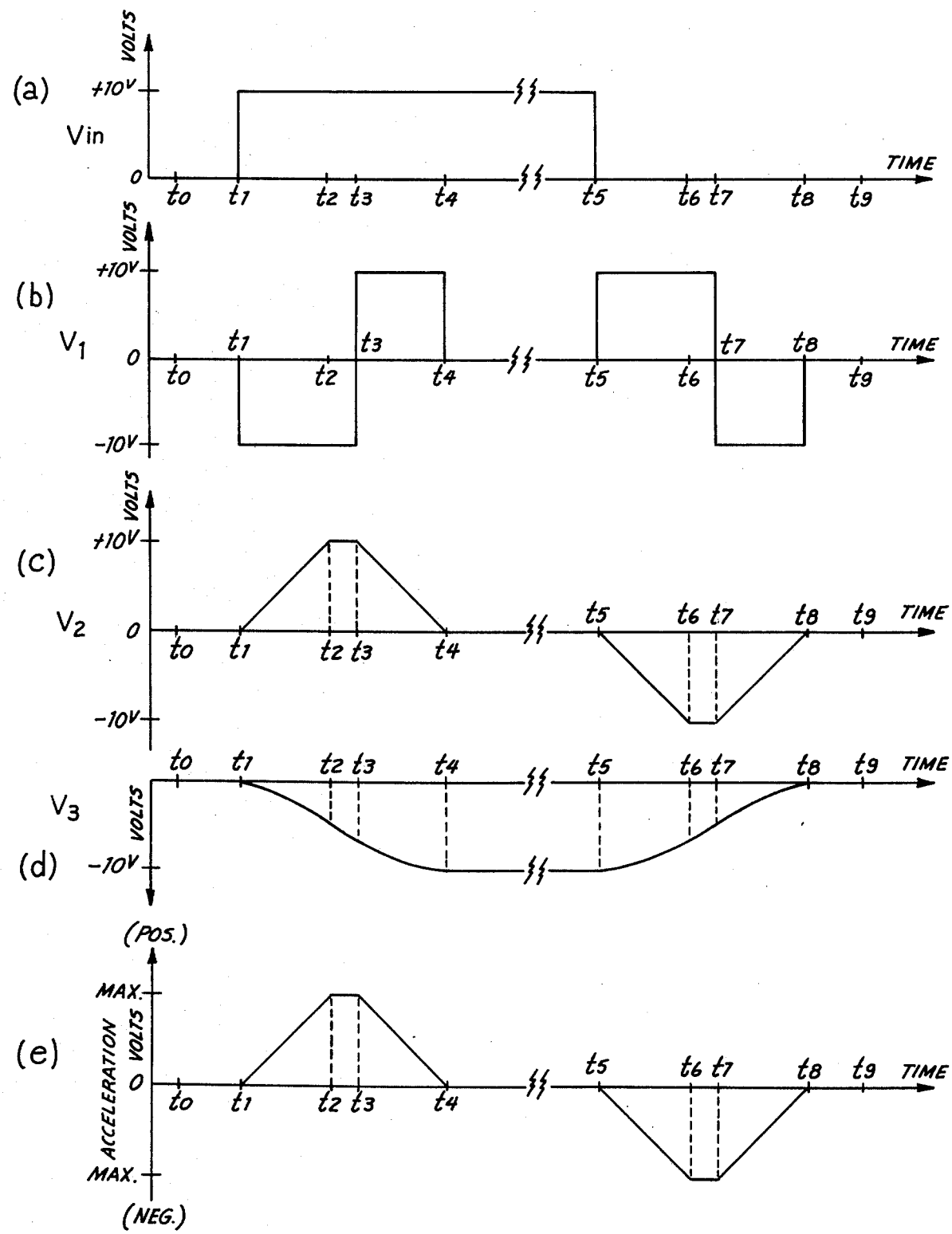
FIG. 2, consisting of parts a, b, c, d and e, depicts some of the waveforms illustrating the invention method and as may be found in the circuit of FIG. 1, and an accelerating curve; and, FIG. 3 is similar to FIG. 1 but is further simplified.

FIG. 2 consists of parts a, b, c, d and e which show some of the waveforms of the circuit of FIG. 1 and which show the shape of the resultant acceleration curve. The waveforms of FIG. 2 will now be described in conjunction with the circuit of FIG. 1. At time $t_o$, the voltages $V_{in}$, $V_1$, $V_2$ and $V_3$ are all zero volts. At time $t_1$, a positive step input (see FIG. 2a) is applied to the input terminal of FIG. 1 (voltage $V_{in}$). In the present example the maximum level of the step input is +10 volts and the step input remains at the +10 volt level until time $t_5$, when it is removed and the voltage $V_{in}$ returns to zero volts. The application, at $t_1$, of the voltage $V_{in}$ to the input of FIG. 1 commences the production of the desired voltage control signal (i.e., signal $V_3$). Amplifier 11 almost instantly produces a voltage $V_1$ (FIG. 2b) which is also a step voltage but is negative since voltage $V_{in}$ is applied to the inverting input of amplifier 11 via resistor 10. The step voltage $V_1$ is limited to an absolute maximum level (e.g., 10 volts) by device 12, and since voltage $V_{in}$ is +10 volts, output voltage $V_1$ limits at −10 volts almost instantly.

Since the output voltage $V_1$ from amplifier 11 is a negative step and the voltage $V_1$ is fed to the input of integrator 28, the output voltage $V_2$ (FIG. 2c) from integrator 28 consists of the integration of the voltage $V_1$. This is, of course, a ramp signal which starts almost instantly at time $t_1$ and ramps linearly upwards (i.e., increases positively at a constant rate) until its voltage is limited by device 17 (at +10 volts in this case) at time $t_2$ as can be seen from FIG. 2c. Voltage $V_2$ increases positively since integrator 28 receives a negative input and amplifier 15 is connected in the inverting mode; therefore, a negative input to integrator 28 results in a positive output and vice-versa.

Output voltage $V_2$ is then fed to integrator 29 and the voltage signal $V_3$ (FIG. 2d) from integrator 29 is consequently the integration of voltage $V_2$. Accordingly, signal $V_3$ consists of the integration of voltage $V_2$ which is a ramp signal (FIG. 2c) from time $t_1$ to time $t_2$. The integration of such a ramp signal is the arc of a circle starting from zero volts at approximately time $t_1$ and increasing in magnitude negatively until time $t_2$ when voltage $V_2$ of FIG. 2c reaches a maximum. Signal $V_3$ is negative since voltage $V_2$ is positive and is fed to the inverting input of amplifier 21 via resistor 19. Accordingly, a positive voltage input to integrator 29 results in a negative output ($V_3$) and vice-versa.

From time $t_2$ to $t_3$ voltage $V_{in}$ remains constant at +10 volts; accordingly, voltage $V_1$ (FIG. 2b) also remains constant at its voltage limited level of −10 volts. Voltage $V_2$ (FIG. 2c) reached its maximum positive value (+10 volts) at time $t_2$ and since voltage $V_2$ is voltage limited at this level, and since integrator 28 is still integrating the voltage $V_1$ (i.e., still trying to increase the output voltage $V_2$), voltage $V_2$ remains constant at +10 volts for time $t_2$ to $t_3$. Since integrator 29 is integrating voltage $V_2$, which is a constant voltage (see FIG. 2c) for the time period $t_2$ to $t_3$, the output signal $V_3$ from amplifier 21 now becomes a linear ramp increasing negatively from time $t_2$ to $t_3$ (FIG. 2d).

At time $t_3$, the resultant of the voltages applied to the inverting input of amplifier 11 (i.e., via resistors 10, 23 and 27) becomes negative, and due to the high gain of amplifier 11, this negative voltage results in a positive output voltage $V_1$ from amplifier 11 which is voltage limited by device 12 at a level of +10 volts. Voltage $V_1$ changes from −10 volts to +10 volts almost instantaneously at time $t_3$ (FIG. 2b). Voltage $V_{in}$ remains constant at +10 volts and voltage $V_2$ begins to ramp linearly downward (i.e., becomes less positive) from +10 volts (see FIG. 2c). Voltage $V_2$ begins to decrease since it is the inverted integration of voltage $V_1$ which is now at a constant positive value. Voltage $V_1$ remains at a constant positive value from time $t_3$ to $t_4$, and accordingly voltage $V_2$ decreases linearly during this same time period. Signal $V_3$ continues to increase negatively during the time from $t_3$ to $t_4$ but it increases negatively at a decreasing rate since signal $V_3$ is the integration of voltage $V_2$ which is decreasing (the shape of voltage $V_3$ plotted against time for the period $t_3$ to $t_4$ is the arc of a circle).

At time $t_4$ voltage $V_2$ has just reached zero volts (FIG. 2c) and signal $V_3$ has just reached its maximum negative value (−10 volts). Accordingly, since voltage $V_{in}$ is at +10 volts, signal $V_3$ is at −10 volts and the output of amplifier 25 is at 0 volts, the net input to amplifier 11 via resistors 10, 23 and 27 is 0 volts and consequently voltage $V_1$ switches almost instantaneously, at time $t_4$, from a value of +10 volts to a value of zero volts. Since $V_1$ is now zero volts, the input to amplifier 15 is zero volts and accordingly the output voltage $V_2$ from amplifier 15 remains at zero volts. Since the voltage $V_2$ is at zero volts, signal $V_3$ which is the time integral of voltage $V_2$ remains at the value it held at time $t_4$; namely, −10 volts. In other words, we now have a steady state condition with $V_{in}$ at +10 volts, $V_3$ at −10 volts and both $V_1$ and $V_2$ at 0 volts. This state remains until time $t_5$ when voltage $V_{in}$ is switched to zero volts. It should be noted that voltage signal $V_3$ (FIG. 2d) can be considered as representative of speed and accordingly the derivative of voltage $V_3$ with respect to time, indicative of acceleration (FIG. 2e), is in the shape of a trapezoid and in actual fact the same shape is shown by voltage $V_2$ (FIG. 2c) during the same time period. This is due to the fact that the integral of $V_2$ is voltage $V_3$, therefore the derivative of $V_3$ is voltage $V_2$ (ignoring any constants of integration).

When voltage $V_{in}$ is switched to 0 volts at time $t_5$, voltage $V_1$ goes to its maximum positive value (+10 volts) almost instantly and remains there until time $t_7$. Voltage $V_1$ goes to +10 volts almost instantly since just prior to switching $V_{in}$ to zero volts (i.e., time $t_4$ to $t_5$) the circuit had been at equilibrium with $V_{in}$ at +10 volts and $V_3$ at −10 volts and $V_2$ at 0 volts. Accordingly, when $V_{in}$ becomes zero (at time $t_5$) signal $V_3$ is the only signal (or voltage) being applied to the inverting input of amplifier 11. The result of this negative voltage signal on the inverting input of amplifier 11 is to produce a positive voltage $V_1$ on the output of amplifier 11 which rises almost immediately to the limiting voltage level (determined by device 12; i.e., +10 volts), since there is a large voltage signal on the inverting input of amplifier 11. Voltage $V_1$ is fed to integrator 28 where output voltage $V_2$ is a ramp voltage, as before, only this time it increases linearly in a negative direction from a zero volts value at time $t_5$ to a maximum negative value (−10 volts in this case) at time $t_6$, limited by device 17. Voltage $V_2$ is fed to integrator 29 and signal $V_3$, the output from integrator 29, consists of the integration of $V_2$ which results in the arc of a circle decreasing negatively from time $t_5$ to $t_6$ (FIG. 2d).

At time $t_6$, voltage $V_1$ is still limited by device 12 and accordingly it remains constant at its maximum positive value of +10 volts for the time period $t_6$ to $t_7$. At time $t_6$ voltage $V_2$, which is the integral of voltage $V_1$, reaches its maximum negative value (−10 volts) and remains constant at this level for the time period $t_6$ to $t_7$. During the time $t_6$ to $t_7$, signal $V_3$, which is the integral of voltage $V_2$, becomes a linear ramp, decreasing negatively (i.e., becoming less negative, see FIG. 2d).

At time $t_7$, signal $V_3$ becomes too small to produce a resultant negative signal at the inverting input of amplifier 11 and the voltage from amplifier 25, which is positive, produces a resultant positive voltage at the inverting input of amplifier 11. Accordingly, voltage $V_1$ becomes negative almost immediately at time $t_7$ and, because of the high gain of amplifier 11, voltage $V_1$ is almost immediately limited at its maximum negative value (−10 volts) by device 12. As a result, voltage $V_2$ starts to ramp linearly back to 0 volts and, at time $t_8$, voltage $V_2$ is zero. Signal $V_3$, which is the integral of voltage $V_2$ is therefore the arc of a circle which is decreasing negatively and reaches zero volts at time $t_8$.

At time $t_8$, voltage $V_{in}$, $V_1$, $V_2$ and $V_3$ are all zero volts; therefore, there is no voltage applied to the inverting input of amplifier 11 and voltages $V_{in}$, $V_1$, $V_2$ and $V_3$ remain at zero volts until the process is started again by changing $V_{in}$.

It should be noted that a similar result could have been obtained with the circuit of FIG. 1 if a negative step voltage had been used for $V_{in}$. The only difference would be that the polarities of the resultant waveforms (i.e., voltages $V_1$, $V_2$ and $V_3$) would have been the opposite polarities from those shown.

Typical round times (e.g., $t_1$ to $t_2$) are in the order of from zero to ten seconds and typical total acceleration times (e.g., $t_1$ to $t_4$) are in the order of two minutes, depending upon the values of the components employed. These typical time limits are given since they are adequate for most industrial applications of the present invention; they should not, however, be considered to be a limitation of the invention.

The control of the various parameters of the circuit will now be described. The main portions of the voltage signal $V_3$ (FIG. 2d) which need to be controlled are the rounds and the ramps. The rounds are the portions of the curve between times $t_1$ and $t_2$, and $t_3$ and $t_4$, etc. and the ramp is the linear portion of the curve between $t_2$ and $t_3$, etc. Once these parameters are fixed for the portion of the curve between times $t_0$ and $t_4$ they remain the same for that portion of the curve between times $t_5$ and $t_9$. The basic parameters to be described are: a) the round time which is the length of time between $t_1$ and $t_2$ and also between $t_3$ and $t_4$; b) the ramp time which is the length of time between $t_2$ and $t_3$; c) the ramp rate, which is the slope of the signal $V_3$ between $t_2$ and $t_3$; and d) the radius of the rounds.

The round time is controlled by the values of resistor 14 and capacitor 16 of integrator 28. Accordingly, to alter the round time either capacitor 16 or resistor 14 can be varied. Increasing the value of resistor 14 increases the round time and increasing the value of capacitor 16 also increases the round time. In other words, the faster integrator 28 integrates the voltage $V_1$ and reaches its maximum voltage level as controlled by limiting device 17, the shorter is the round time, and vice-versa. This is indicated by the slew rate of integrator 28 (the round time varies inversely as the slew rate) wherein the slew rate ($S_R$) is given by the formula:

$$S_R = \frac{K \cdot V_1}{(\text{resistor } 14) \cdot (\text{capacitor } 16)}$$

wherein:
$S_R$ = slew rate
K = a constant
$V_1$ = voltage input to integrator 28 in volts (resistor 14) = value of resistor 14 in ohms (capacitor 16) = value of capacitor 16 in farads.

Alternately, the voltage $V_1$ could be varied to adjust the round time.

Once the round time is set, the ramp time $t_2$ to $t_3$ is automatically determined. This occurs since it is desired that the total time for signal $V_3$ to go from its start to its maximum negative value is the period $t_1$ to $t_4$. Accordingly, if time periods $t_1$ to $t_2$ and $t_3$ to $t_4$ are used for rounds, then time period $t_2$ to $t_3$ is all that is left for the ramp time period and it is therefore automatically determined once the total time $t_1$ to $t_4$ and the round times are set. The ramp time is adjusted by potentiometer 20 to its predetermined value thus determined.

The radius of the rounds in time periods $t_1$ to $t_2$ and $t_3$ to $t_4$ as well as the ramp rate (i.e., slope of the ramp) in time period $t_2$ to $t_3$ are determined by the slew rate of integrator 29. The higher the slew rate of integrator 29 the lower the ramp rate and the smaller the radius of the rounds and vice-versa. The slew rate for the integrator 29 is given by the formula:

$$S_R = \frac{C \cdot V_2}{(\text{resistor } 19) \cdot (\text{capacitor } 22)}$$

wherein:
$S_R$ = slew rate
C = constant
$V_2$ = voltage input to integrator 29 in volts (resistor 19) = value of resistor 19 in ohms (capacitor 22) = value of capacitor 22 in farads.

To ensure that the circuit of FIG. 1 produces the smooth curve as shown in FIG. 2d, the circuit values must be chosen such that there is a correspondence between the various parameters. In other words, once the round time is set, the ramp time must be set taking the round time and the total time ($t_1$ to $t_4$) into consideration. Similarly, once the round times and ramp times have been set, then the ramp rate and round radius must be set taking into account the previously set parameters. The values given in this specification for the components and voltages shown in FIG. 1 are for one specific case only, and they can be varied to obtain different waveforms as desired.

Figure 3:
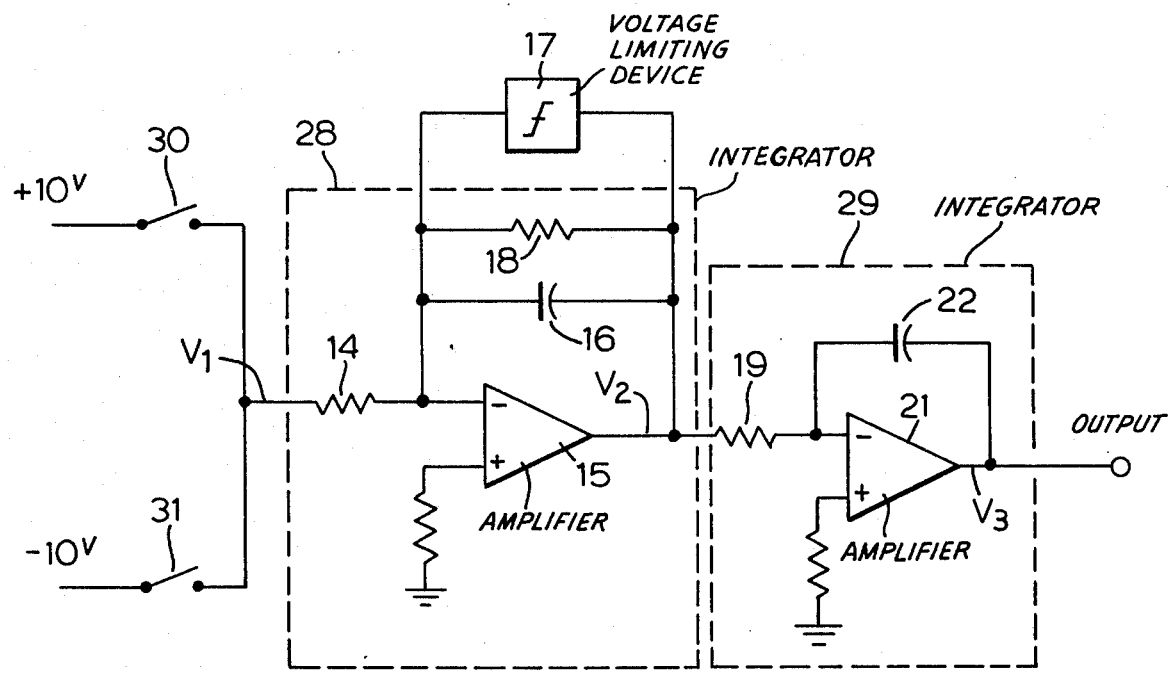

FIG. 3 shows a simplified version of the circuit depicted in FIG. 1. FIG. 3 contains the integrators 28 and 29 of FIG. 1 as well as the voltage limiting device 17 of FIG. 1. The input to the circuit of FIG. 3 consists of predetermined values illustrated as either +10 volts, −10 volts or 0 volts as controlled by switches 30 and 31. Switches 30 and 31 can be operated to reproduce the waveform shown in FIG. 2b; namely, voltage $V_1$, which is then input to integrator 28 of FIG. 3 as was voltage $V_1$ to integrator 28 of FIG. 1. The output of FIG. 3 is, then, the curve shown in FIG. 2d. The major difference between FIG. 1 and FIG. 3 is that FIG. 1 contains additional circuitry to automatically produce the curve of FIG. 2d in response to a simple step input voltage such as that shown in FIG. 2a. FIG. 3, on the other hand, needs a switchable input voltage such as that shown in FIG. 2b. The apparatus for producing the switchable input voltage for FIG. 3 is shown, for simplicity's sake, as two manually operable switches 30 and 31. Switches 30 and 31 can be operated manually, in response to a timed sequence or in response to a voltage signal indicative of the voltage signal $V_3$ on the output of FIG. 3, or any other desired criterion to produce a curve similar to that shown in FIG. 2d. Alternately, switches 30 and 31 can be automated to function in response to ancillary equipment, etc.

While there have been shown and described what are at present considered to be the preferred embodiments of the present invention, modifications thereto will readily occur to those skilled in the art. It is not desired, therefore, that the invention be limited to the specific arrangements shown and described and it is intended to cover in the appended claims all such modifications as fall within the true spirit and scope of the invention.

What is claimed is:

1. A circuit for producing an electric output signal having a waveshape the first derivative of which approximates a trapezoid, said circuit comprising:
   a. switching means selectively operable to provide a first signal which varies between a zero value, and relatively positive and negative values;
   b. a first integrator responsive to said first signal to provide a second signal;
   c. means to limit the magnitude of said second signal; and,
   d. a second integrator responsive to said second signal to provide said electric output signal.

2. The invention in accordance with claim 1 wherein said switching means is manually operable.

3. The invention in accordance with claim 1 wherein said switching means is operable in response to the values of said second signal and said electric output signal.

4. The invention in accordance with claim 1 wherein said switching means includes a high gain amplifier and wherein means are further included to provide signals proportional said second signal and said electric output signal to an input of said amplifier to control the value of said first signal.

5. A circuit for producing an electric output signal having a waveshape the first derivative of which approximates a trapezoid, said circuit comprising:
   a. switching means selectively operable to provide a first signal which varies between a zero value and relatively positive and negative values;
   b. a first integrating circuit responsive to said first signal for outputting a voltage signal limited in magnitude; and,
   c. a second integrating circuit responsive to said voltage signal to provide said electric output signal.

6. The invention in accordance with claim 5 wherein said switching means is manually operable.

7. The invention in accordance with claim 5 wherein said switching means is operable in response to the values of said second signal and said electric output signal.

8. The invention in accordance with claim 5 wherein said switching means includes a high gain amplifier and wherein means are further included to provide signals proportional said second signal and said electric output signal to an input of said amplifier to control the value of said first signal.

9. A circuit responsive to an input signal for producing an electrical signal having a waveshape consisting of approximately circular portions and approximately straightline portions wherein said straightline portions are approximately tangential to said circular portions so as to provide a relatively smooth transition from one portion to another, said circuit comprising:
   a. a high gain amplifier with a voltage limited output;
   b. a first integrator connected in series with the output of said high gain amplifier and responsive to said output to provide an output voltage limited in magnitude;
   c. a second integrator connected in series with the output of said first integrator and providing said electrical signal as its output; and,
   d. means for providing first and second feedback signals proportional, respectively, to the outputs of said first and second integrators to an input of said high gain amplifier to control the output of said amplifier.

10. The method of producing an electrical voltage signal having a waveshape consisting of approximately circular portions and approximately straight line portions wherein said straight line portions are approximately tangential to said circular portions, said method comprising:
    a. selectively inputting either a step voltage signal or a zero voltage to a first amplifier having a voltage limited output;
    b. feeding the output signal from said first amplifier to a first integrator having a voltage limited output;
    c. feeding the output signal from said first integrator to a second integrator which produces said electrical voltage signal;
    d. feeding a portion of the output signal from said second integrator to an input of said first amplifier; and,
    e. feeding a portion of the output signal from said first integrator to said input of said first amplifier after first inverting said last mentioned portion.

11. The method of producing an electrical signal having a waveshape the first derivative of which approximates a trapezoid, said method comprising:
    a. selectively providing an input signal of generally stepped voltage waveshape, which varies between a zero value and relatively positive and negative values, to a first integrator having a voltage limited output;
    b. feeding the output of said first integrator into a second integrator which outputs said electrical signal; and,
    c. utilizing the output of said second integrator in a feedback mode to determine which of a positive step voltage, a negative step voltage and a zero voltage should be applied to the input of said first integrator.

* * * * *